United States Patent
Naito et al.

(10) Patent No.: US 11,337,333 B2
(45) Date of Patent: May 17, 2022

(54) COOLING UNIT THAT DISCHARGES HEAT FROM HEAT SOURCE AND ELECTRONIC APPARATUS EQUIPPED WITH THE COOLING UNIT

(71) Applicant: CANON KABUSHIKI KAISHA, Tokyo (JP)

(72) Inventors: Go Naito, Kawasaki (JP); Masafumi Kimura, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/158,347

(22) Filed: Jan. 26, 2021

(65) Prior Publication Data
US 2021/0153381 A1 May 20, 2021

Related U.S. Application Data

(63) Continuation of application No. 16/416,565, filed on May 20, 2019, now Pat. No. 10,939,577.

(30) Foreign Application Priority Data

May 30, 2018 (JP) .............................. JP2018-103583

(51) Int. Cl.
*H05K 7/20* (2006.01)
*G03B 17/55* (2021.01)
(Continued)

(52) U.S. Cl.
CPC ... *H05K 7/20145* (2013.01); *G02F 1/133385* (2013.01); *G03B 17/55* (2013.01);
(Continued)

(58) Field of Classification Search
CPC ............ H05K 7/20145; H05K 7/20163; G02F 1/133385; G03B 21/16; G03B 2217/002
See application file for complete search history.

(56) References Cited

U.S. PATENT DOCUMENTS 3,652,895 A * 3/1972 Tsuneta ................. H01J 29/076
313/403
7,697,288 B2 4/2010 Okutsu
(Continued)

FOREIGN PATENT DOCUMENTS

JP H08321696 A 12/1996
JP 2004022786 A 1/2004

OTHER PUBLICATIONS

Office Action issued in U.S. Appl. No. 16/416,565 dated Jun. 9, 2020.
(Continued)

*Primary Examiner* — Stephen S Sul
(74) *Attorney, Agent, or Firm* — Rossi, Kimms & McDowell LLP

(57) ABSTRACT

A cooling unit can be downsized. Air is taken in through an intake port, and heat is discharged from a heat source through an exhaust port. A heat transport unit, forming a part of a cooling fan or is substantially in contact with it, has a first region which has one end facing the heat source and another end having a through hole which air taken in or air to be discharged passes through, and in which air passes through the through hole to perform heat exchange with the air in an inner wall of the through hole. The cooling fan has an intake opening and an exhaust opening. The through hole has an intake through hole and/or an exhaust through hole. Air passes through the intake port, the intake through hole, the intake opening, the exhaust opening, the exhaust through hole, and the exhaust port in this order.

2 Claims, 12 Drawing Sheets

(51) Int. Cl.
  *H04N 5/225* (2006.01)
  *H04N 9/31* (2006.01)
  *G02F 1/1333* (2006.01)
  *G03B 21/16* (2006.01)

(52) U.S. Cl.
  CPC ......... *G03B 21/16* (2013.01); *H04N 5/22521* (2018.08); *H04N 9/3144* (2013.01); *H05K 7/20163* (2013.01); *H05K 7/20172* (2013.01); *G03B 2217/002* (2013.01)

(56) References Cited

U.S. PATENT DOCUMENTS

| | | |
|---|---|---|
| 7,948,750 B2 | 5/2011 | Hung |
| 2004/0095728 A1 | 5/2004 | Bird |
| 2007/0242436 A1 | 10/2007 | Cheng |
| 2008/0174956 A1 | 7/2008 | Alex |
| 2008/0174958 A1 | 7/2008 | Horng |
| 2009/0135563 A1 | 5/2009 | Sakata |
| 2009/0141450 A1 | 6/2009 | Sakata |
| 2011/0103017 A1 | 5/2011 | Yu |
| 2011/0279974 A1 | 11/2011 | Fujiwara |
| 2012/0194995 A1* | 8/2012 | Wang ...................... G06F 1/203 361/679.47 |
| 2014/0036440 A1 | 2/2014 | Inoue |
| 2015/0136366 A1* | 5/2015 | Fukui ...................... F28D 7/005 165/148 |
| 2015/0382482 A1* | 12/2015 | Hiyama ................. B23K 1/012 228/42 |
| 2016/0006911 A1 | 1/2016 | Kimura |
| 2018/0278814 A1 | 9/2018 | Yamamoto |

OTHER PUBLICATIONS

Notice of Allowance issued in U.S. Appl. No. 16/416,565 dated Nov. 5, 2020.

* cited by examiner

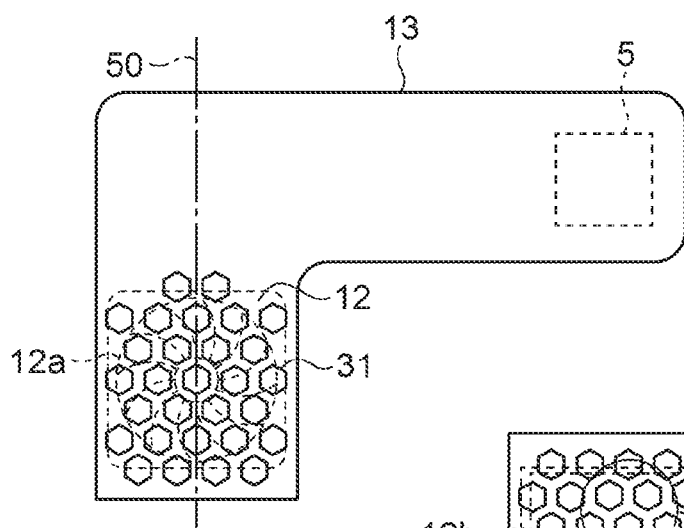
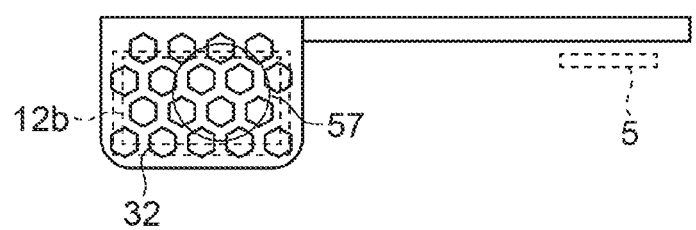
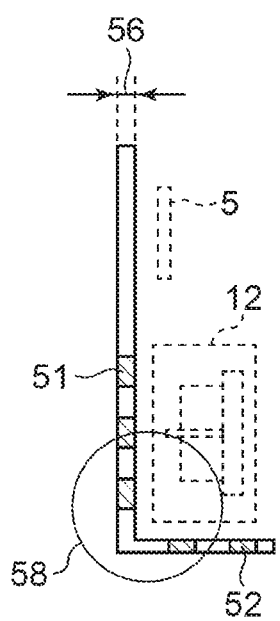
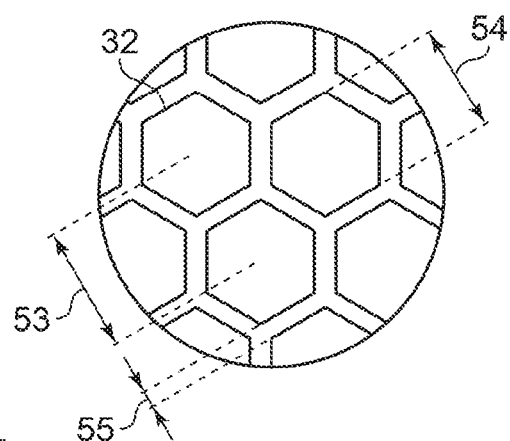
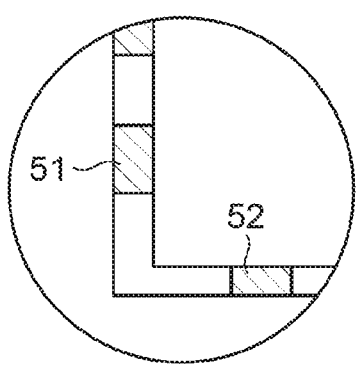

COOLING UNIT THAT DISCHARGES HEAT FROM HEAT SOURCE AND ELECTRONIC APPARATUS EQUIPPED WITH THE COOLING UNIT

BACKGROUND OF THE INVENTION

Field of the Invention

The present invention relates to a cooling unit and an electronic apparatus that makes use thereof, and in particular to a cooling unit equipped with a cooling fan.

Description of the Related Art

Electronic apparatuses such as digital cameras, smart phones, tablets, and game machines tend to consume more power due to increased capabilities or the like nowadays. On the other hand, there is a high demand for downsizing those types of electronic apparatuses so as to improve portability.

Heat generated in the electronic apparatuses increases due to increased power consumption, downsizing, and so forth, and accordingly, heat needs to be efficiently discharged. In order to efficiently discharge heat, for example, a cooling unit equipped with a cooling fan is used.

For example, in order to reduce the thickness of a cooling unit equipped with a cooling fan and to improve cooling efficiency, a part of a fan case is made of a copper plate, and heat is transported to a heat radiating fin, which is a heat radiation main part, by a heat pipe and the fan case (Japanese Laid-Open Patent Publication (Kokai) No. 2004-22786).

However, even in the case where the cooling unit described in Japanese Laid-Open Patent Publication (Kokai) No. 2004-22786 is used, the heat radiating fin for heat exchange needs to be provided separately from the fan case, and the cooling unit is upsized accordingly, making it difficult to downsize an electronic apparatus.

SUMMARY OF THE INVENTION

The present invention provides a cooling unit that can be downsized, and an electronic apparatus equipped with the cooling unit.

Accordingly, the present invention provides a cooling unit that has an intake port and an exhaust port and drives at least one cooling fan to take in air through the intake port and discharge heat from a heat source through the exhaust port, includes a heat transport unit configured to have at least one first region which has one end facing the heat source, has another end at which a through hole which air taken in through the intake port or air discharged from the exhaust port passes through is formed, and in which air is caused to pass through the through hole to perform heat exchange with the air in an inner wall of the through hole, wherein an intake opening and an exhaust opening, which extends in a different direction in which the intake opening extends, are formed in the cooling fan, the through hole includes at least one of an intake through hole or an exhaust through hole, the cooling fan is driven to pass air through the intake port, the intake through hole, the intake opening, the exhaust opening, the exhaust through hole, and the exhaust port in this order, and the heat transport unit forms a part of the cooling fan or is provided in contact with the cooling fan.

According to the present invention, the cooling unit and the electronic apparatus can be downsized because heat is exchanged in a through-hole region defined in a heat transport unit.

Further features of the present invention will become apparent from the following description of exemplary embodiments (with reference to the attached drawings).

BRIEF DESCRIPTION OF THE DRAWINGS

FIGS. 6A to 6E are views explaining a heat transport unit shown in FIGS. 5A and 5B.

DESCRIPTION OF THE EMBODIMENTS

An example of a cooling unit according to embodiments of the present invention will now be described with reference to the drawings.

Figure 1A:
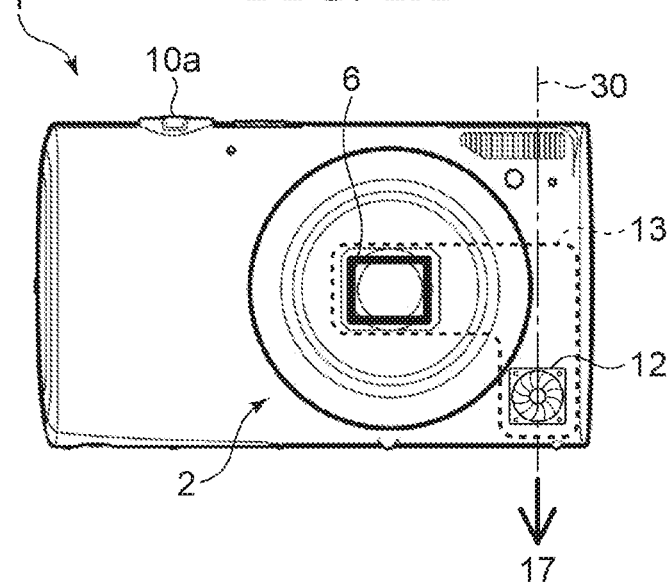
FIGS. 1A to 1C are views showing an example of an electronic apparatus for which a cooling unit according to a first embodiment of the present invention is used.
Figure 1B:
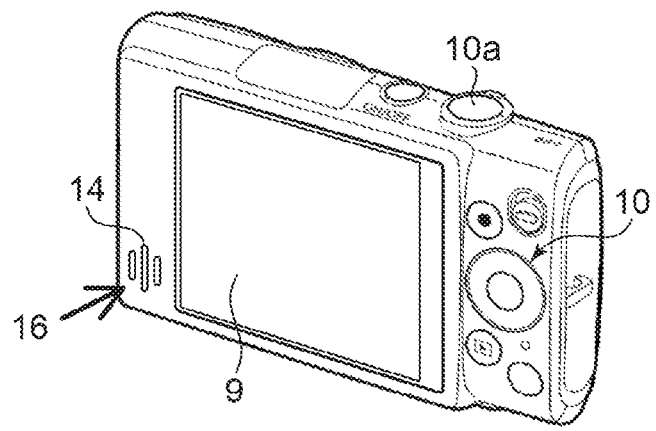
Figure 1C:
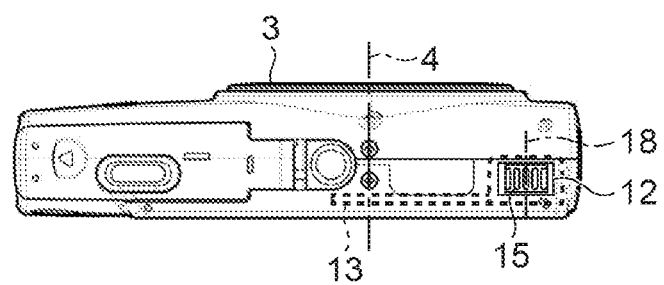

FIGS. 1A to 1C are views showing an example of an electronic apparatus for which a cooling unit according to a first embodiment of the present invention is used. FIG. 1A is a front view, FIG. 1B is a perspective view from behind, and FIG. 1C is a bottom view. It should be noted here that an image pickup apparatus is taken as an example of the electronic apparatus.

The illustrated electronic apparatus is, for example, a digital camera (hereafter referred to merely as the camera) 1, and a lens barrel 2 is provided on a front side of the camera 1. A shooting optical system 3 including a plurality of optical lenses is disposed in the lens barrel 2. The shooting optical system 3 has an optical axis 4.

A shutter release button 10a is disposed on an upper side of a camera housing (image pickup apparatus housing), and a cooling fan 12 is disposed inside the camera housing. For the shooting optical system 3, an image pickup device is placed inside the camera case, and various types of operating units 10 and a display unit 9 such as an LCD are disposed on a rear side of the camera case.

As illustrated, an intake port 14 is formed on the rear side of the camera housing, and an exhaust port 15 is formed on a bottom side of the camera housing. Driving (rotating) the cooling fan 12 takes in air through the intake port 14 as indicated by a solid line arrow 16 and causes air to be discharged through the exhaust port 15 via the heat transport unit 13 as indicated by a solid line arrow 17. It should be noted that a reference number 18 denotes a rotational axis of the cooling fan 12.

Figure 2A:
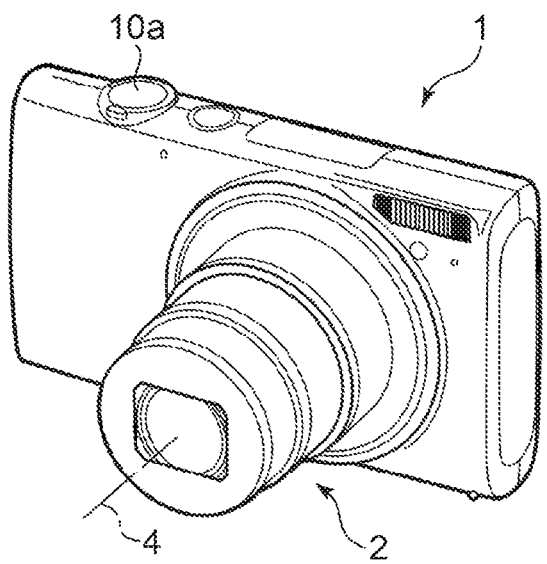
FIGS. 2A to 2C are views explaining an arrangement of a camera shown in FIGS. 1A to 1C.
Figure 2B:
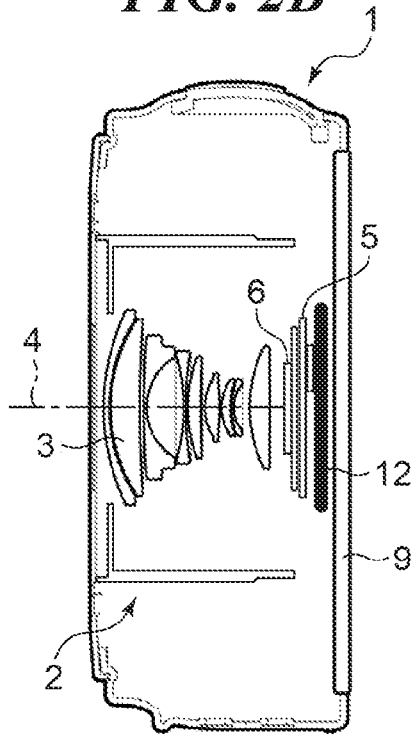
Figure 2C:
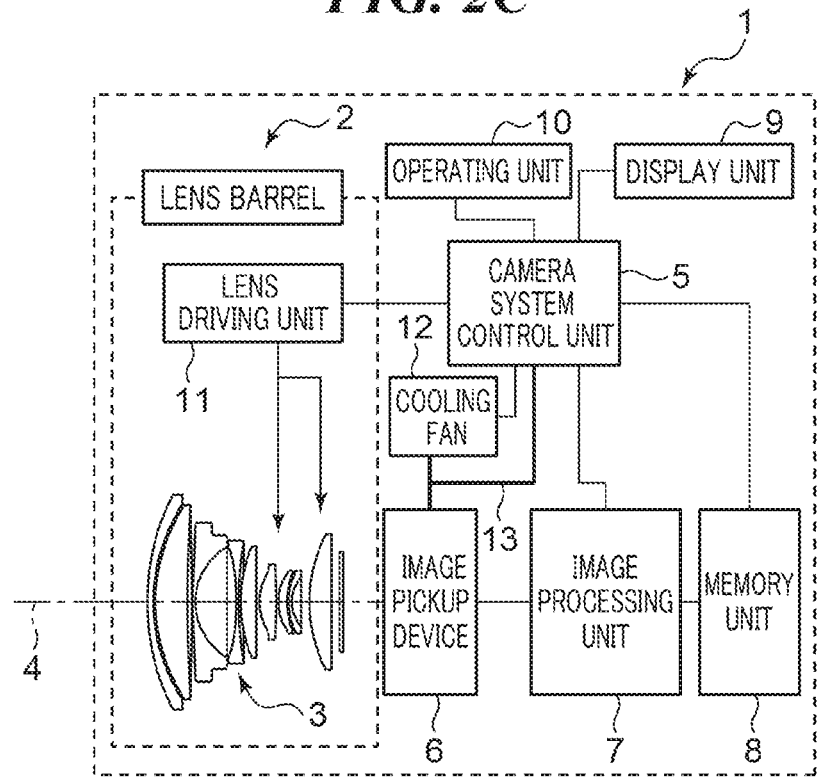

FIGS. 2A to 2C are views explaining an arrangement of the camera 1 shown in FIGS. 1A to 1C. FIG. 2A is a perspective view showing the camera 1 as seen from front with the lens barrel 2 extended, and FIG. 2B is a cutaway view showing the camera 1 as seen from side with the lens barrel 2 collapsed. FIG. 2C is a block diagram showing the arrangement of the camera 1.

The illustrated camera 1 has a camera system control unit (control unit) 5, which is responsible for controlling the entire camera 1. An optical image is formed on the image pickup device 6 through the shooting optical system 3, and the image pickup device 6 outputs an image signal corresponding to the optical image. Under the control of the camera system control unit 5, an image processing unit 7 performs predetermined image processing on the image signal to generate image data and then records the image data in a memory unit 8.

In response to the image signal obtained from the image pickup device 6, the camera system control unit 5 causes a lens driving unit 11 to drive a focus lens, a blur correction lens, a diaphragm, and so forth provided in the shooting optical system 3 to perform focus adjustment or the like and also control exposure. Namely, the camera system control unit 5 performs AF control and AE control. It should be noted that exposure control includes control of an exposure time, an f number, and an amplification factor.

The image processing unit 7 has an A/D converter, a white balance circuit, a gamma correction circuit, an interpolation operation circuit, and so forth, and as described earlier, generates image data according to an image signal which is an output from the image pickup device 6.

The memory unit 8 has a recording unit that records image data and others and a processing circuit required for recording. Here, the memory unit 8 records image data in the recording unit and generates and saves a display image for output to the display unit 9.

It should be noted that the memory unit 8 carries out a compression process in which it compresses image data using a method determined in advance. The memory unit 8 also has a nonvolatile memory in which programs to be executed by the camera system control unit 5 are recorded and a volatile memory in which the programs are expanded. The volatile memory is used as a work area for the camera system control unit 5.

The camera system control unit 5 controls the camera 1 in response to operation on the operating units 10. For example, upon detecting depression of the shutter release button 10a, the camera system control unit 5 drives the image pickup device 6, controls the image processing unit 7, and also controls, for example, the compression process carried out by the memory 8. The camera system control unit 5 also displays a variety of information on the display unit 9.

The camera system control unit 5 determines an appropriate focus position and aperture position based on an image signal obtained from the image pickup device 6. Then, the camera system control unit 5 causes the lens driving unit 11 to control the shooting optical system 3 based on the focus position and also adjusts an aperture of the diaphragm base on the aperture position.

It should be noted that in an aiming operation of the camera 1, the camera system control unit 5 successively displays live previews of images, which are obtained by the image pickup device 6, on the display unit 9.

As described earlier, the camera 1 is equipped with the cooling fan 12, and according to a state of the camera 1, the camera system control unit 5 causes the cooling fan 12 to run (rotate). As a result, heat is discharged by the so-called forced air cooling.

The heat transport unit 13 (FIGS. 1A, 1C) is disposed in opposed relation to the image pickup device 6 and the camera system control unit 5, which are heat sources, and an intake part or an exhaust part of the cooling fan 12. This efficiently transports and discharges heat which is generated in the image pickup device 6, the camera system control unit 5, and their vicinities.

Figure 3A:
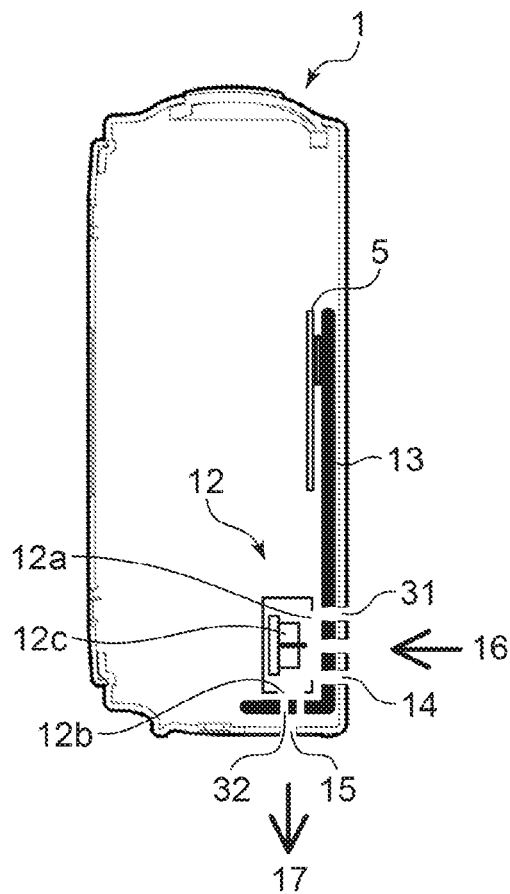
FIGS. 3A to 3C are views explaining an example of a cooling unit provided in the camera shown in FIGS. 1A to 1C.
Figure 3B:
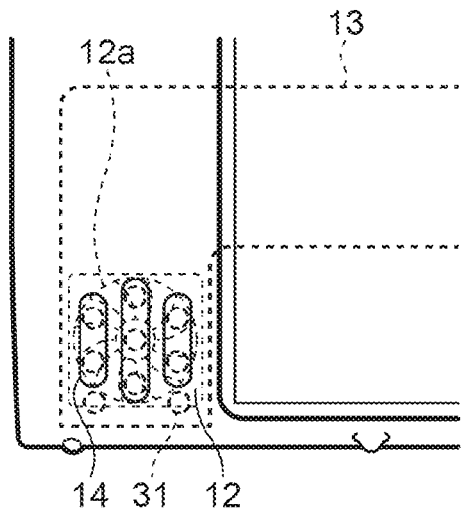
Figure 3C:
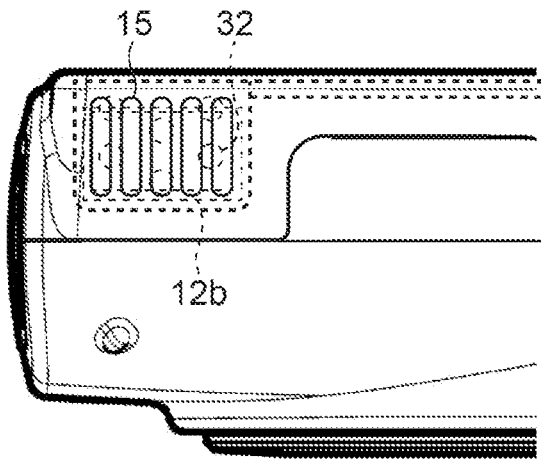

FIGS. 3A to 3C are views explaining an example of a cooling unit provided in the camera 1 shown in FIGS. 1A to 1C. FIG. 3A is a view showing a cross section of a part indicated by an alternate long and short dash line 30 in FIG. 1A, and FIG. 3B is an enlarged view showing the intake port 14 provided on the rear side of the camera 1. FIG. 3C is an enlarged view showing the exhaust port 15 provided on the bottom side of the camera 1.

An intake through hole 31 and an exhaust through hole 32 are formed in the heat transport unit 13. An intake opening 12a and an exhaust opening 12b are formed in the cooling fan 12. The fan 12 is equipped with a rotary blade 12c.

To cool the camera 1 with the cooling fan 12, heat generated in the camera system control unit 5 and the image pickup device 6, which are the heat sources, is transported to the cooling fan 12 by the heat transport unit 13. The illustrated example shows a state in which the camera system control unit 5 is thermally connected to the heat transport unit 13, but the image pickup device 6 may be thermally connected to the heat transport unit 13.

As shown in FIG. 3A, one end (first end) of the heat transport unit 13 is thermally connected with facing a heat source such as the camera system control unit 5 (and the image pickup device 6). Another end (second end) of the heat transport unit 13 faces the intake opening 12a and the exhaust opening 12c.

When air is taken in through the intake port 14 by the cooling fan 12 and passes through the intake through holes 31 formed in the heat transport unit 13, heat exchange is performed. Then, the air flows into the cooling fan 12 through the intake opening 12a and is discharged through the exhaust opening 12b. On this occasion, heat exchange is performed again when the air passes through the exhaust through holes 32 formed in the heat transport unit 13, and the air is discharged from the camera 1 through the exhaust port 15.

As shown in FIG. 3B, the plurality of intake through holes 31 is formed in the heat transport unit 13, and likewise, as shown in FIG. 3C, the plurality of exhaust through holes 32 is formed in the heat transport unit 13. By providing the heat transport unit 13 with the plurality of intake through holes 31 and exhaust through holes 32, heat exchange can efficiently be performed because side areas of the through holes themselves are increased as will be described later.

In conventional electronic apparatuses such as a camera equipped with a cooling fan, heat is transported from a heat source such as a control unit to a heat exchange unit provided around an exhaust or intake opening of the cooling fan. The heat exchange unit then exchanges the heat with air taken in by the cooling fan.

A description will now be given of an example in which the cooling structure (cooling unit) described above is used for a camera.

Figure 4A:
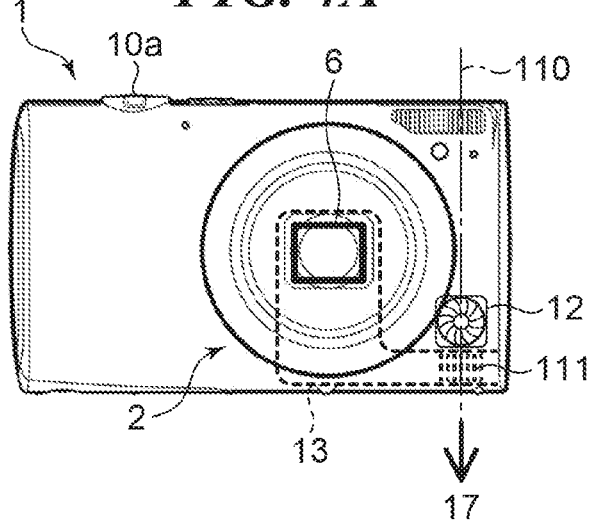
FIGS. 4A to 4E are views explaining an example of a camera with a conventional cooling structure.
Figure 4B:
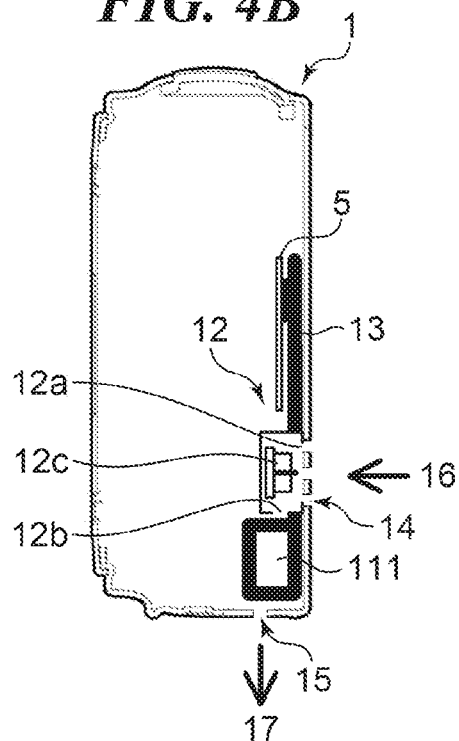
Figure 4C:
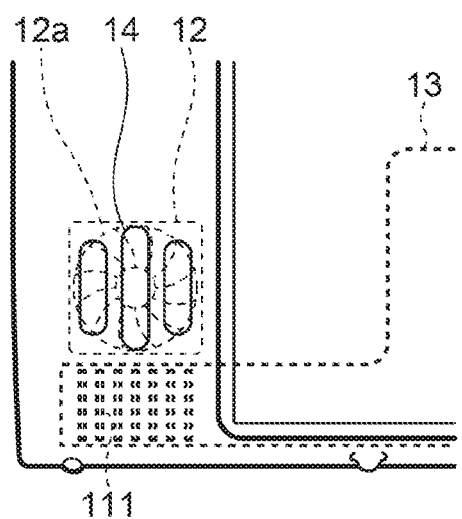
Figure 4D:
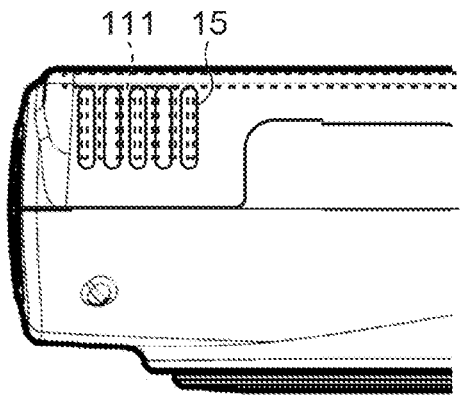
Figure 4E:
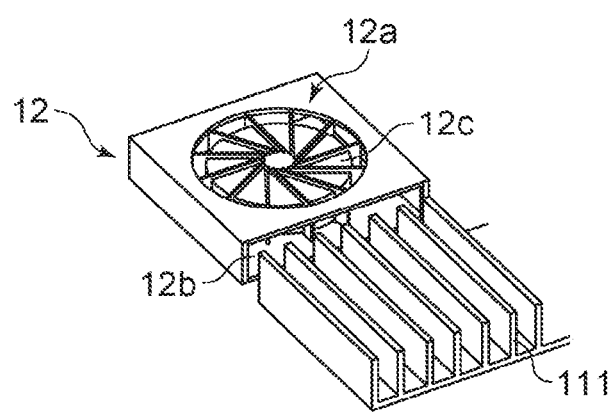

FIGS. 4A to 4E are views explaining an example of a camera provided with the conventional cooling structure. FIG. 4A is a front view of the conventional camera, and FIG. 4B is a cross-sectional view taken along an alternate long and short dash line 110 in FIG. 4A. FIG. 4C is an enlarged view of an intake port provided on a rear side of the camera, and FIG. 4D is an enlarged view of an exhaust port provided on a bottom side of the camera. FIG. 4E is a perspective view of the cooling fan 12 and a heat exchange unit. It should be noted that in FIGS. 4A to 4E, the same component elements as those of the camera shown in FIGS. 1A to 1C and 3A to 3C are denoted by the same reference numbers.

The heat exchange unit 111 is disposed in opposed relation to the exhaust opening 12b of the cooling fan 12. The heat exchange unit 111 is molded to have large surface areas of a radiating fin and a part for heat exchange which is called a heat sink.

In the illustrated example, the heat exchange unit 111 is disposed in front of the exhaust opening 12b of the cooling fan 12, and air discharged by the cooling fan 12 is subjected to heat exchange by the heat exchange unit 111. Heat generated in the camera system control unit 5 (and the image pickup device 6) is transported to the heat exchange unit 111 by the heat transport unit 13. The heat exchange unit 111 then subjects the heat to heat exchange with the air taken in by the cooling fan 12. Namely, in the example illustrated in FIGS. 4A to 4E, the heat exchange unit 111 is required for heat exchange in addition to the heat transport unit 13.

On the other hand, in the cooling unit shown in FIGS. 3A to 3C, since the through-holes for heat exchange are provided in the heat transport unit 13, the heat transport unit 13 doubles as a heat exchanger and thus dispenses with the heat exchange unit 111.

A detailed description will now be given of the cooling unit according to the first embodiment of the present invention.

Figure 5A:
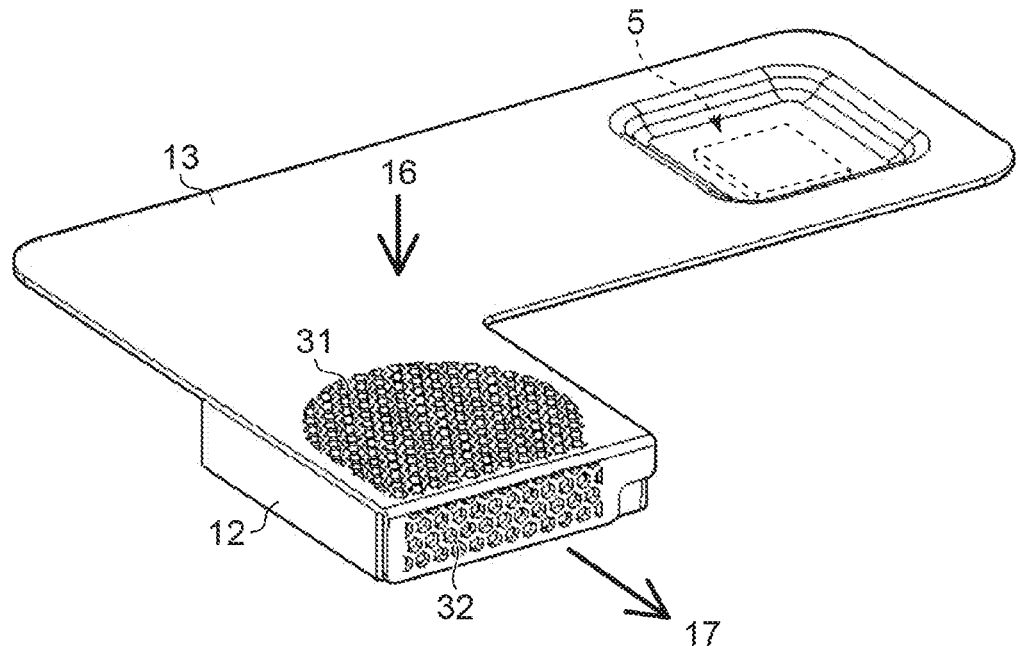
FIGS. 5A and 5B are views explaining an arrangement of the cooling unit provided in the camera shown in FIGS. 1A to 1C.
Figure 5B:
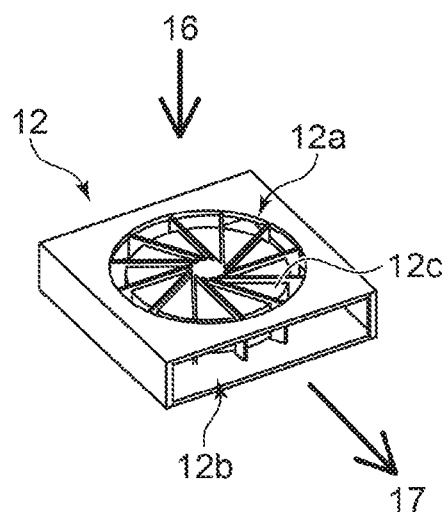

FIGS. 5A and 5B are views explaining an arrangement of the cooling unit provided in the camera 1 shown in FIGS. 1A to 1C. FIG. 5A is a perspective view of the cooling unit, and FIG. 5B is a perspective view of the cooling fan 12 provided in the cooling unit.

The illustrated cooling unit has the heat transport unit 13 and the cooling unit 12 which are substantially in contact with each other (preferably, they are in contact with each other), and the heat transport unit 13 has one end (first end) thereof facing the camera system control unit 5, which is the heat source, and another end (second end) thereof facing the cooling fan 12. As described earlier, the intake through holes 31 and the exhaust through holes 32 are formed on the side corresponding to the cooling fan 12 (see FIG. 5A). As shown in FIG. 5B, for example, a centrifugal fan is used as the cooling fan 12, and in response to rotation of the rotary blade 12c, air is taken in a direction of the rotational axis (that is, in a thickness direction of the heat transport unit 13) as indicated by a solid line arrow 16 and discharged in the direction of the radius of the rotary blade 12c (that is, in the direction of the thickness of the heat transport unit 13) as indicated by a solid line arrow 17. It should be noted that the heat transport unit 13 may form a part of the cooling fan 12.

Namely, the heat transport unit 13 may form an upper side of the cooling fan 12 and/or one or more sides of the cooling fan 12.

FIGS. 6A to 6E are views explaining the heat transport unit 13 shown in FIGS. 5A and 5B. FIG. 6A is a front view of the heat transport unit 13, and FIG. 6B is a bottom view of the heat transport unit 13. FIG. 6C is a cross-sectional view taken along an alternate long and short dash line 50 in FIG. 6A, and FIG. 6D is an enlarged view of an area indicated by a circle 57 in FIG. 6B. FIG. 6E is an enlarged view of an area indicated by a circle 58 in FIG. 6C. It should be noted that a front side of the heat transport unit 13 in FIG. 6A means a side seen from behind the camera 1.

As described above with reference to FIGS. 3A to 3C, heat generated in the camera system control unit 5 (and the image pickup device 6) is transported by the heat transport unit 13. Then, in the intake through holes 31 and the exhaust through holes 32 formed in the heat transport unit 13, the heat is subjected to heat exchange with air taken in or discharged by the cooling fan 12.

The plurality of intake through holes 31 is formed in opposed relation to the intake opening 12a formed in the cooling fan 12, and likewise, the plurality of exhaust through holes 32 is formed in opposed relation to the exhaust opening 12b formed in the cooling fan 12.

Referring to FIG. 6E, diagonally shaded areas 51 represent intake through hole sides (inner walls) of the intake through holes 31 in which heat exchange with the air taken in by the cooling fan 12 is performed. Likewise, diagonally shaded areas 52 represent exhaust through hole sides (inner walls) of the exhaust through holes 32 in which heat exchange with the air is performed.

Referring to FIG. 6D, a description will now be given of a relationship between aperture ratios of the intake through holes 31 and the exhaust through holes 32 and heat exchange efficiency and a relationship between side areas of the intake through holes 31 and the exhaust through holes 32 and heat exchange efficiency.

The aperture ratio is an indicator that indicates the proportion of through holes in a base material per unit area. For example, as shown in FIG. 6D, when the intake through holes 31 and the exhaust through holes 32 are formed in a staggered arrangement of 60° hexagons (the so-called honeycomb pattern), the aperture ratio Ar is expressed by an equation (1) below.

$$Ar = \frac{(P-d)^2}{P^2} \times 100 = \frac{W^2}{P^2} \times 100 \qquad \text{Equation (1)}$$

In the equation (1), P denotes a center-to-center distance (pitch) between the hexagonal through holes, which is indicated by reference number 53 in FIG. 6D. Also, d indicates a width (thickness) indicated by a reference number arrow 55 in FIG. 6D. Further, W indicates a width (opening width) of the thorough holes, which is indicated by a reference number 54. It should be noted that p is greater than d (P>d).

As described earlier, heat exchange is performed in the intake through holes 31 and the exhaust through holes 32. The larger the intake through holes 31 and the exhaust through holes 32, the easier it becomes for the air to pass and the lower the resistance (hereafter referred to as the draft resistance) becomes when the air passes. Therefore, when heat exchange is performed while the air is passing through the intake through holes 31 and the exhaust through holes 32, the heat exchange efficiency increases with aperture ratio. Namely, in the equation (1), the deeper the relationship P>>d, the higher the heat exchange efficiency.

The heat exchange efficiency increases with areas of the side faces (inner walls) of the through holes in which heat exchange is performed increase. In the heat transport unit 13, heat exchange with the air taken in by the cooling fan 12 is performed in the intake through holes 31 and the exhaust through holes 32. Namely, the larger the side areas (areas of side walls) of the intake through hole side faces 51 and the exhaust through hole side faces 52, the larger the area where heat exchange is performed. For this reason, assuming that the flow rate of the air passing through the through holes does not change, the heat exchange efficiency increases as the side areas become larger.

Here, the proportion of the side areas of the through holes in the base material of the heat transport unit 13 per unit area is referred to as a side area ratio. For example, when both the intake through holes 31 and the exhaust through holes 32 are formed in a staggered arrangement of 60° hexagons, the side area ratio Ar is expressed by an equation (2) below.

$$Sr = \frac{4t(P-d)}{P^2} \times 100 = \frac{4tW}{P^2} \times 100 \qquad \text{Equation (2)}$$

In the equation (2), p, d, and W are the same as those in the above equation (1), and t indicates a thickness of the heat transport unit 13, which is indicated by reference number 56 in FIG. 6C.

To increase the side area ratio Sr, the thickness t should be increased and/or the pitch P and the width d should be decreased. It should be noted that p and d are preferably minimum values depending on machining conditions. Moreover, it is ideally preferable that p and d satisfy the equation, P=2d, at which Sr is the maximum.

The above described conditions relating to the aperture ratio and the side area ratio for increasing the heat exchange efficiency are mutually contradictory. Namely, in order to increase the aperture ratio, it is preferable that the pitch P is increased while the width d is decreased. On the other hand, in order to increase the side area ratio, it is preferable that the pitch P is decreased while the width d is made close to P/2.

What conditions are the most suitable depends on the performance of the cooling fan 12, and to mold the heat transport unit 13 with a plate-like material (for example, a metal sheet), the side areas of the through holes should be very small, and hence it is preferable that the pitch P is reduced to such an extent that the draft resistance is not excessively high.

A description will now be given of an example of a relationship between the heat source and the widths of the intake through holes 31 and the exhaust through holes 32.

Figure 7A:
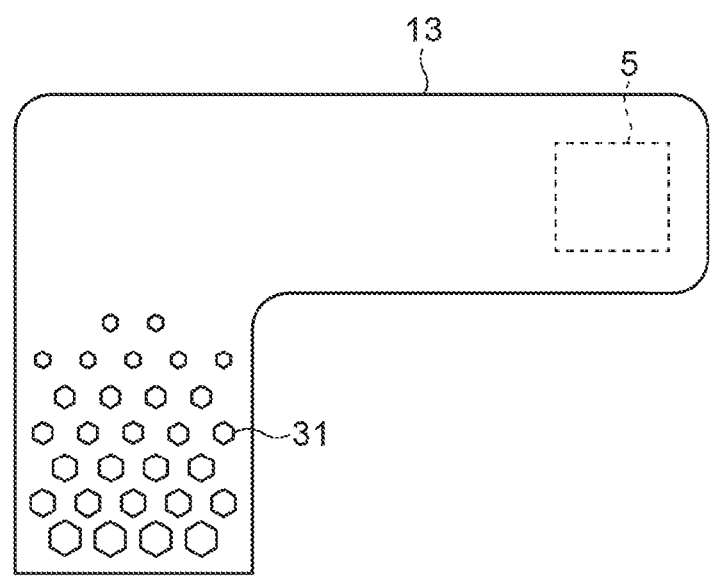
FIGS. 7A and 7B are views explaining an example of a relationship between a position of a camera system control unit shown in FIGS. 5A and 5B and through holes formed in the heat transport unit.
Figure 7B:
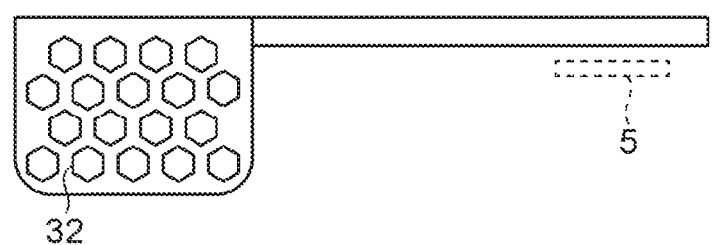

FIGS. 7A and 7B are views explaining an example of the relationship between the position of the camera system control unit 5 shown in FIGS. 5A and 5B and the through holes formed in the heat transport unit 13. FIG. 7A is a front view of the heat transport unit 13, and FIG. 7B is a bottom view of the heat transport unit 13.

As described earlier, the heat transport unit 13 acts as both a heat transporter and a heat exchanger. In terms of heat transportation, the air with very low thermal conductivity is present in the area where the intake through holes 31 and the exhaust through holes 32 are formed, and this is a factor responsible for interfering with heat transportation.

The heat exchange efficiency will increase if heat is satisfactorily transported to the through holes far from the heat source, and heat exchange is performed in the sides (inner walls) of many through holes. It is thus preferable that in the heat transport unit 13, higher priority is given to heat transportation in areas closer to the heat source.

For example, as shown in FIG. 7A, the width 54 of the intake through holes 31 (the width 54 of the intake through holes 31 on the upper side of the sheet surface in the drawing) is made small. By making the width 54 of the intake through holes 31 smaller, the width 55 of the base material of the heat transport unit 13 is increased, which enhances heat transportation performance.

As described above, the width 54 of the intake through holes 31 is made smaller in areas closer to the camera system control unit 5 which is the heat source. As a result, a larger amount of heat can be transported to the through holes far from the heat source, that is, to the exhaust through holes 32, and the heat exchange efficiency can be increased.

In the example described above, the heat transportation performance is enhanced by decreasing W (the width 54 in FIG. 6D) in the equation (1) to the aperture ratio small. On the other hand, the heat transportation performance can be enhanced by increasing P (the pitch 53 in FIG. 6D) in the equation (1) as well. If P is increased without changing W, d (the width 55 in FIG. 6D) will be increased to similarly enhance the heat transportation performance. Namely, in the heat transport unit 13, heat transportation performance can be enhanced by making the aperture ratio in the equation (1) smaller in areas closer to the heat source.

A description will now be given of a relationship between the cooling fan and the width of the through holes.

Figure 8A:
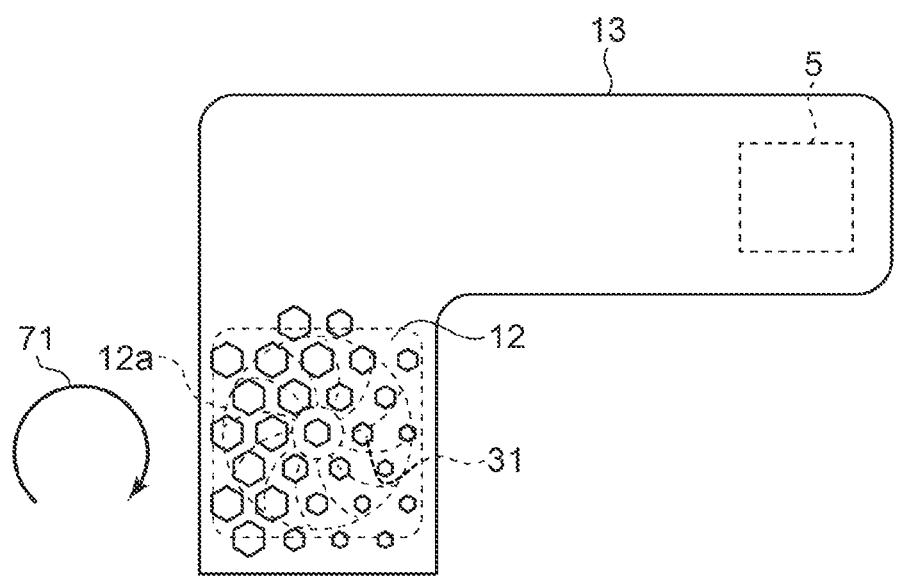
FIGS. 8A and 8B are views explaining a relationship between a rotational direction of a cooling fan shown in FIGS. 5A and 5B and through holes formed in the heat transport unit.
Figure 8B:
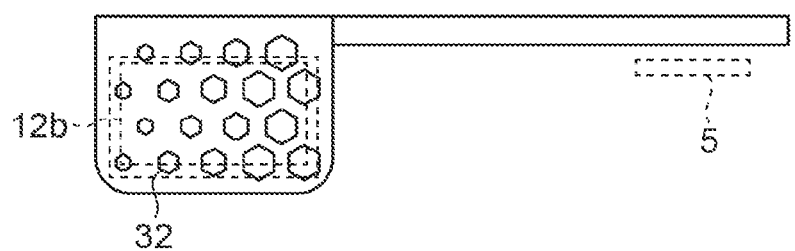

FIGS. 8A and 8B are views explaining the relationship between the rotational direction of the cooling fan 12 shown in FIGS. 5A and 5B and the through holes formed in the heat transport unit 13. FIG. 8A is a front view of the heat transport unit 13, and FIG. 8B is a bottom view of the heat transport unit 13.

In general, the distribution of speeds (flow rates) of air flowing into the cooling fan 12 through the intake opening 12a and the exhaust opening 12b varies with rotational directions of the cooling fan 12. Reference number 71 indicates the rotational direction of the cooling fan 12. Assume now that the cooling fan 12 is rotating in a rotational direction 71. In this case, when air is discharged downward on the sheet surface in FIG. 8A, the flow rate of the air flowing into the cooling fan 12 on a left-hand side of the intake opening 12a on the sheet surface is higher in the distribution of flow rates around the intake opening 12a. On the other hand, on a right-hand side on the sheet surface, the flow rate of the air flowing into the cooling fan 12 is low.

Referring to FIG. 7B, in the distribution of flow rates around the exhaust opening 12b, the flow rate of the air flowing out of the cooling fan 12 is high on the right-hand side of the sheet surface, and the flow rate of the air flowing out of the cooling fan 12 is low on the left-hand side of the sheet surface.

Therefore, the heat transport performance is improved by reducing the width of the through holes located in the area where the flow rate is low, and heat is transported to the through holes located in the area where the flow rate is high. This improves the heat exchange efficiency.

For example, as shown in FIG. 8A, the closer to the area where the flow rate is high, the wider the widths of the intake through holes 31 and the exhaust through holes 32, and the closer to the area where the flow rate is low, the narrower the widths of the intake through holes 31 and the exhaust through holes 32. As a result, heat is transported to the through holes whose side area ratio is large and heat exchange efficiency is high, and this enables efficient heat exchange.

It should be noted that when the rotational direction of the cooling fan 12 is opposite to the rotational direction 71, the relationship of width between the through holes is reversed as well. Namely, the widths of the through holes are larger on the right-hand side of the sheet surface, and the widths of the through holes are smaller on the left-hand side of the sheet surface.

As described above, since the side area ratio is increased by increasing W (the width 54 in FIG. 6D in the equation (2) for the through holes located in the areas where the flow rate is higher, the wide area ratio is made larger to improve the heat exchange efficiency.

On the other hand, the heat exchange efficiency may be improved by decreasing P (the pitch 54 in FIG. 6D) in the equation (2). When P is decreased without changing W for the through holes located in the areas where the flow rate is higher, d (the width 55 in FIG. 6D) is decreased, which makes the side area ratio larger and improves the heat exchange efficiency. Namely, in the heat transport unit 13, the heat exchange efficiency can be improved by increasing the side area ratio for the through holes located in the areas where the flow rate is higher.

A description will now be given of a relationship between the rotational direction of the cooling fan 12 and the position at which the heat source is installed.

Figure 9A:
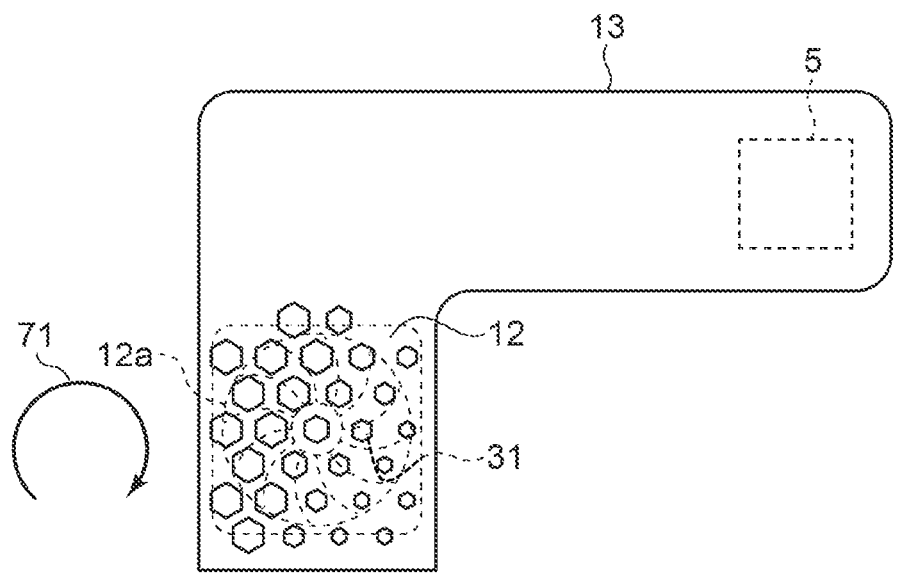
FIGS. 9A and 9B are views explaining a relationship between a rotational direction of the cooling fan shown in FIGS. 5A and 5B and a position of a heat source.
Figure 9B:
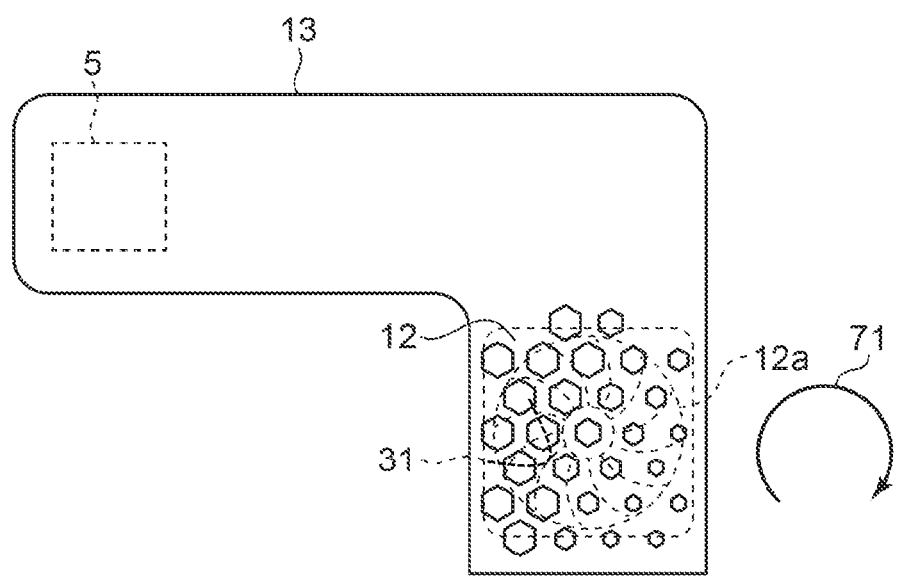

FIGS. 9A and 9B are views explaining the relationship between the rotational direction of the cooling fan 12 shown in FIGS. 5A and 5B and the position of the heat source. FIG. 9A is a view showing an example of the relationship between the rotational direction of the cooling fan 12 and the position of the camera system control unit 5 which is the heat source, and FIG. 9B is a view showing an example of the relationship between the rotational direction of the cooling fan 12 and the position of the camera system control unit 5 which is the heat source.

In FIG. 9A, the camera system control unit 5, which is the heat source, is disposed in an area where the flow rate is low (on the right-hand side of the sheet surface) with respect to the rotational direction 71 of the cooling fan 12. A part of the heat transport unit 13 which is opposed to the camera system control unit 5 extends toward an area where the flow rate is low as seen from the cooling fan 12.

On the other hand, in FIG. 9B, the camera system control unit 5, which is the heat source, is placed in an area where the flow rate is high (on the left-hand side of the sheet surface). A part of the heat transport unit 13 which is opposed to the camera system control unit 5 extends toward an area where the flow rate is high as seen from the cooling fan 12.

As described earlier with reference to FIGS. 7A and 7B, in the heat transport unit 13, by reducing the width of the through holes located closer to the heat source, the heat exchange efficiency is improved because heat can be transported to an area far from the heat source. On the other hand, as described earlier with reference to FIGS. 8A and 8B, making the widths of the through holes wider in areas where the flow rate is low depending on the rotational direction of the cooling fan 12 improves the heat exchange efficiency.

Therefore, the rotational direction of the cooling fan 12 is determined according to the layout of the heat transport unit 13 determined by the heat source and the position of the cooling fan 12. For example, as shown in FIG. 9A, in the case where the part opposed to the heat source extends to the right-hand side of the sheet surface as seen from the cooling fan 12, the cooling fan 12 is rotated clockwise. On the other hand, as shown in FIG. 9B, in the case where the part opposed to the heat source extends to the left-hand side of the sheet surface as seen from the cooling fan 12, the cooling fan 12 is rotated counterclockwise.

It should be noted that in the layout shown in FIG. 9B, it is preferable from the standpoint of heat transport performance that the through holes are made narrower on the left-hand side of the sheet surface by laterally reversing the widths of the intake through holes 31.

Figure 10A:
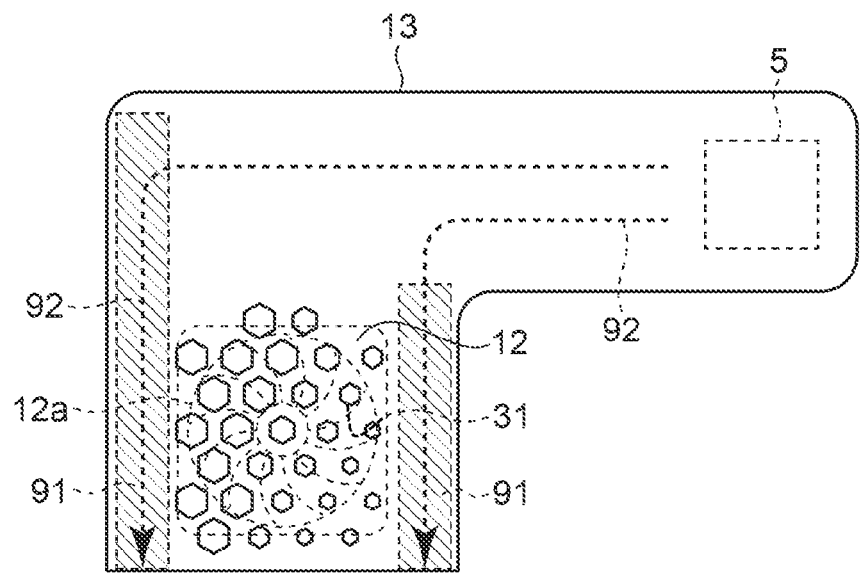
FIGS. 10A and 10B are views explaining a structure around intake through holes and exhaust through holes shown in FIGS. 7A and 7B.
Figure 10B:
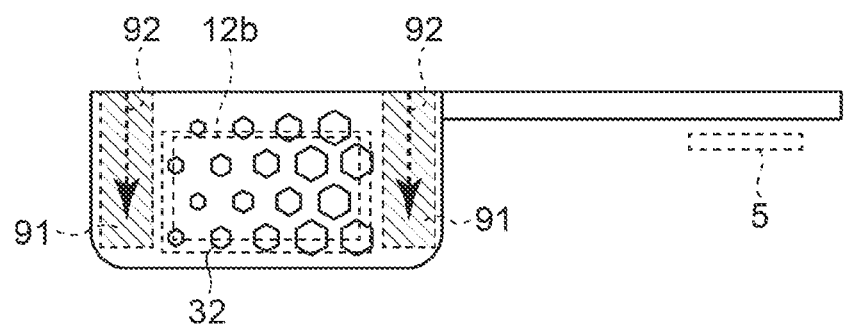

FIGS. 10A and 10B are views explaining a structure of the intake through holes 31 and the exhaust through holes 32 shown in FIGS. 7A and 7B and their vicinities. FIG. 10A is a front view of the heat transport unit 13, and FIG. 10B is a bottom view of the heat transport unit 13.

In FIGS. 10A and 10B, a diagonally shaded areas 91 represents a second region (non through hole region) of the heat transport unit 13 in which neither the intake through holes 31 nor the exhaust through holes 32 are formed. As described earlier, in a first region (through hole region) in which the intake through holes 31 or the exhaust through holes 32 are formed, the performance of the heat transport unit 13 (that is, the heat transport performance) deteriorates. For this reason, the non through hole region is defined around or near the through hole region (the first region) to complement the heat transport performance.

As illustrated, a heat transfer path indicated by a broken line arrow 92 is formed by defining the non through hole region represented by the diagonally shaded area 91. As a result, heat is efficiently transported from the camera system control unit 5, which is the heat source, to the exhaust through holes 32 by the heat transport unit 13. This improves the heat exchange efficiency.

Figure 11A:
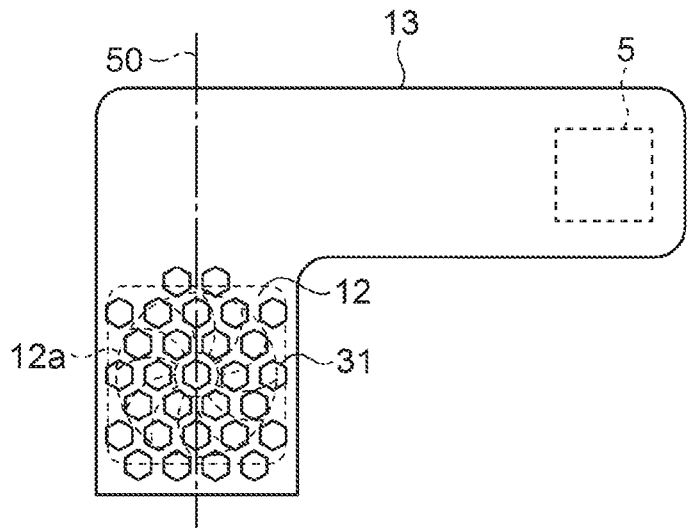
FIGS. 11A to 11D are views explaining an example of an arrangement of intake through holes and exhaust through holes shown in FIGS. 7A and 7B.
Figure 11B:
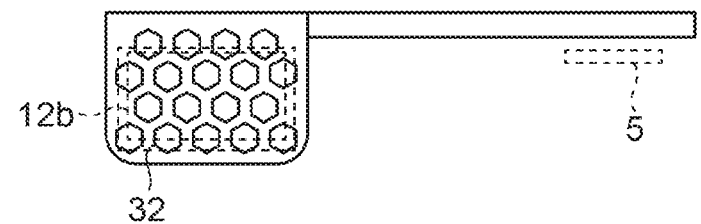
Figure 11C:
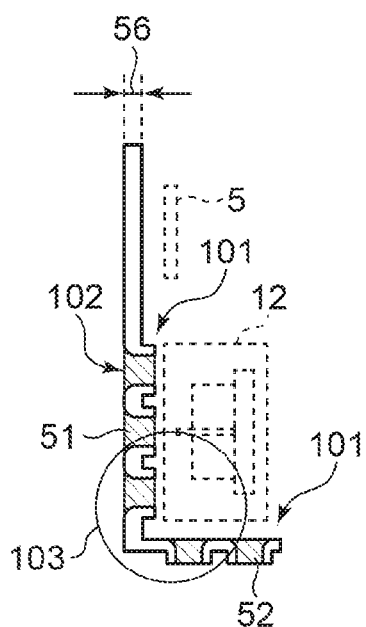
Figure 11D:
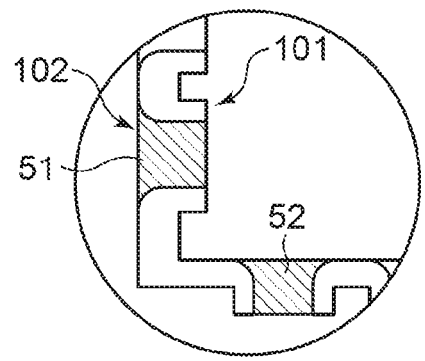

FIGS. 11A to 11D are views explaining an example of an arrangement of the intake through holes 31 and exhaust through holes 32 shown in FIGS. 7A and 7B. FIG. 11A is a front view of the heat transport unit 13, and FIG. 11B is a bottom view of the heat transport unit 13. FIG. 11C is a cross-sectional view taken along an alternate long and short dash line 50 in FIG. 11A, and FIG. 11D is an enlarged view of an area indicated by a circle 103 in FIG. 11C.

The illustrated heat transport unit 13 is molded by stamping, and a bending portion 101 is formed at each of one opening ends of the intake through holes 31 and exhaust through holes 32. An R portion (curved portion) 102 is formed at each of the other opening ends of the intake through holes 31 and exhaust through holes 32. For example, the bending portions 101 are burrs left after stamping, and the R portions 102 are sheer droops left after stamping.

As described earlier with reference to FIGS. 6A to 6E, heat exchange is performed while the air passes through the intake through holes 31 and exhaust through holes 32 formed in the heat transport unit 13. For this reason, the larger the side areas of the intake through holes 31 and exhaust through holes 32, the higher the heat exchange efficiency. Therefore, forming the bending portions 101 at the ends of the intake through holes 31 and exhaust through holes 32 increases their height, resulting in their side areas being increased.

Likewise, it can be considered that the thickness 56 (thickness t) in FIG. 6C should increase so as to increase the side areas of the intake through holes 31 and exhaust through holes 32, but this will increase the thickness of the heat transport unit 13. As a result, the camera 1 will be upsized in the direction of the thickness (the direction of the optical axis).

On the other hand, in the example shown in FIGS. 11A to 11D, the side areas of the through holes are increased without changing the thickness of the heat transport unit 13 as long as a way of machining is devised to leave the burrs after stamping. In particular, since the intake through holes 31 and exhaust through holes 32 face the intake port 14, the exhaust port 15, the intake opening 12a, and the exhaust opening 12b, the bending portions 101 can be disposed to get into these openings and the like. As a result, the side areas of the intake through holes 31 and exhaust through holes 32 can be increased without increasing the thickness of the heat transport unit 13.

Furthermore, during heat exchange, as the draft resistance in the intake through holes 31 and exhaust through holes 32 decreases, the heat exchange efficiency increases because the air flows more easily. Accordingly, the R portions 102 are formed such that their diameters widen at the ends of the intake through holes 31 and exhaust through holes 32. This lowers the draft resistance in the intake through holes 31 and exhaust through holes 32 when the air is taken in by the fooling fan 12.

It should be noted that, as shown in FIG. 11D, bending the bending portions 101 and the R portions 102 in the direction in which the air is caused to flow by the cooling fan 12 is preferable because the draft resistance can be lowered.

As described above, in the first embodiment of the present invention, through holes are formed in the heat transport unit 13, and heat exchange is performed in the side faces (inner walls) of the through holes. This eliminates the need to have a heat exchanger for heat exchange and thus downsizes the cooling unit.

It should be noted that although in the example described above, the heat transport unit 13 is opposed to both the intake opening 12a and the exhaust opening 12b to perform heat exchange in both the intake through holes 31 and exhaust through holes 32, the heat transport unit 13 may be opposed to one of the intake opening 12a and the exhaust opening 12b to perform heat exchange.

A description will now be given of an example of a camera for which a cooling unit according to a second embodiment of the present invention is used.

In the first embodiment described above, the cooling unit is equipped with one cooling fan, but the cooling unit may be equipped with a plurality of cooling fans. In the second embodiment described below, the cooling unit is equipped with two cooling fans.

It should be noted that only features of the cooling unit according to the second embodiment differing from those of the cooling unit according to the first embodiment will be described with description of the same features omitted.

Figure 12A:
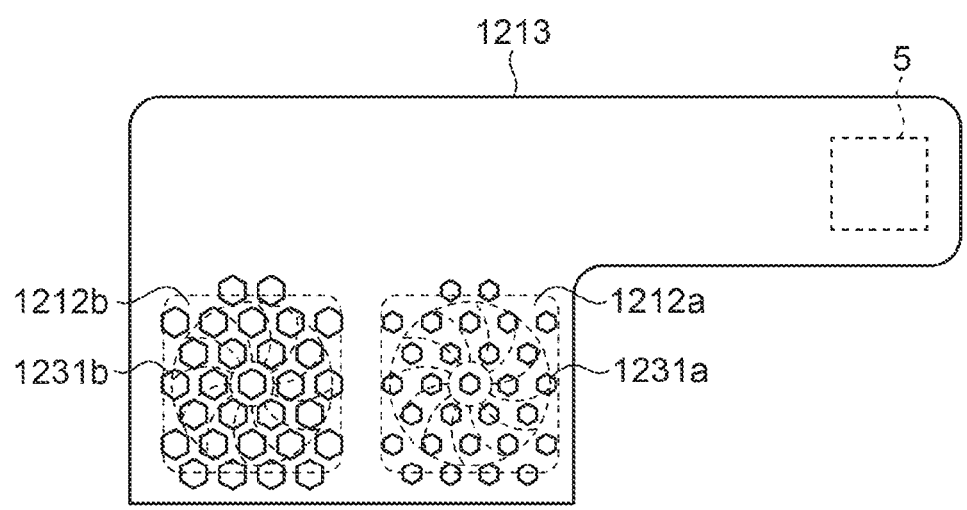
FIGS. 12A and 12B are views explaining an example of a heat transport unit for use in a cooling unit according to a second embodiment of the present invention.
Figure 12B:
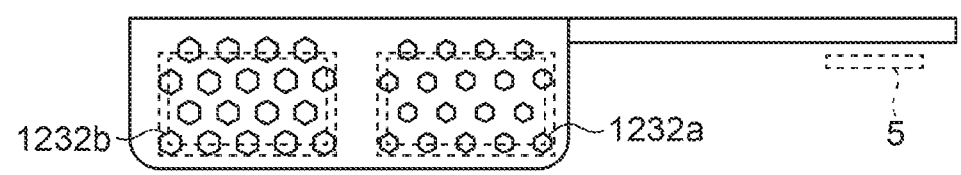

FIGS. 12A and 12B are views explaining an example of a heat transport unit for use in the cooling unit according to the second embodiment of the present invention. FIG. 12A is a front view of the heat transport unit, and FIG. 12B is a bottom view of the heat transport unit.

As illustrated, the cooling unit has two cooling fans 1212a and 1212b, and the heat transport unit 1213 is placed in opposed relation to the cooling fans 1212a and 1212b. The heat transport unit 1213 is also opposed to the camera system control unit 5 which is the heat source.

In the heat transport unit 1213, a first through hole region and a second through hole region are defined in opposed relation to the first cooling fan 1212a and the second cooling fan 1212b, respectively. In the first through hole region, first intake through holes 1231a and first exhaust through holes 1232a are formed, and in the second through hole region, second intake through holes 1231b and second exhaust through holes 1232b are formed.

It should be noted here that the cooling fan located closer to the camera system control unit 5, which is the heat source, is referred to as the first cooling fan 1212a, and the cooling fan located farther away from the camera system control unit 5 is referred to as the second cooling fan 1212b.

In the illustrated example, the first cooling fan 1212a and the second cooling fan 1212b are controlled to rotate at respective predetermined rotation rates. The rotation rate of the first cooling fan 1212a is higher than that of the second cooling fan 1212b. Furthermore, the first intake through holes 1231a and the first exhaust through holes 1232a are smaller than the second intake through holes 1231b and the second exhaust through holes 1232b.

Wind can be let through the first cooling fan 1212a rotating at a relatively high rotation rate even when the draft resistance is high (that is, the flow rate is high). On the other hand, it is difficult to let wind through the second cooling fan 1212a rotating at a relatively low rotation rate when the draft resistance is high (that is, the flow rate is low).

Thus, in the illustrated example, the first intake through holes 1231a and the first exhaust through holes 1232a placed in opposed relation to the first cooling fan 1212a are configured to have small diameters so that the draft resistance can be high. On the other hand, the second intake through holes 1231b and the second exhaust through holes 1232b placed in opposed relation to the second cooling fan 1212b are configured to have large diameters so that the draft resistance can be low.

As described above, in the heat transport unit 1213, the through holes located close to the camera system control unit 5 are configured to have small diameters, and the through holes located away from the camera system control unit 5 are configured to have large diameters. As a result, heat is efficiently transported to the through holes located away from the camera system control unit 5, and this prevents deterioration of heat transport performance in the heat transport unit 1213. In other words, if the through holes located close to the camera system control unit 5 are configured to have large diameters, and the through holes located away from the camera system control unit 5 are configured to have small diameters, losses that do not contribute to transportation of heat would be located close to the heat source, and this leads to deterioration of heat transport performance.

As described above, the rotation rates of the first cooling fan 1212a and the second cooling fan 1212b and the diameters of the through holes formed in the heat transport unit 1213 are set. As a result, when the camera is operating, it is possible to select between a mode in which priority is given to reducing noise of the cooling fans and a mode in which priority is given to cooling. The selection of the modes is executed by the camera system control unit 5 in response to a selecting operation on the operating unit 10.

To reduce noise caused by rotation of a cooling fan during, for example, video shooting (visual and audio recording), a mode in which the second cooling fan 1212b is driven is used. On the other hand, to give priority to cooling when noise caused by rotation of a cooling fan is not annoying, for example, during standby, a mode in which the first cooling fan 1212a is driven is used. Further, when rapid cooling is needed after video shooting or the like, a mode in which the first cooling fan 1212a and the second cooling fan 1212b are driven is used.

Thus, since the camera system control unit 5 selectively controls operation of the first cooling fan 1212a and the second cooling fan 1212b which rotate at different rotation rates, the camera can be cooled suitably for its operating state without controlling the rotation rates of the cooling fans.

As described above, in the second embodiment of the present invention, there is the plurality of cooling fans, and in the heat transport unit, the intake through holes and the exhaust through holes are formed in opposed relation to the cooling fans. The cooling fans are configured to rotate at different rotation rates, and diameters of the intake through holes and the exhaust through holes are varied with positions of the cooling fans. This downsizes the cooling unit and eliminates the necessity for controlling the rotation rates of the cooling fans.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-103583, filed May 30, 2018, which is hereby incorporated by reference herein in its entirety.

What is claimed is:

1. An image pickup apparatus comprising:
an image pickup device configured to receive light entering from a direction of an optical axis of a shooting optical system;
a cooling fan, including an intake opening and an exhaust opening, configured to rotate about a rotational axis that extends in the direction of the optical axis;
an intake port disposed facing the intake opening;
an exhaust port disposed facing the exhaust opening; and
a heat transport unit formed of a metal sheet including through holes, wherein a thickness direction of the metal sheet and a direction in which air passes through the through holes are the same,
wherein the through holes include intake through holes disposed facing the intake opening and exhaust holes disposed facing the exhaust opening,
wherein the cooling fan is driven to:
draw in air through the intake port;
discharge heat from the image pickup device through the exhaust port; and
pass —the—air through the intake port, the intake through holes, the intake opening, the exhaust opening, the exhaust through holes, and the exhaust port, in this order,
wherein a width of each intake through hole becomes larger as the each intake through hole is farther away from the image pickup device, and
wherein a width of each exhaust through hole is the same.

2. The electronic apparatus according to claim 1, wherein an aperture ratio of the intake through holes becomes smaller as the intake through holes are closer to the image pickup device.

* * * * *